(12) United States Patent
Usami

(10) Patent No.: US 7,956,678 B2
(45) Date of Patent: Jun. 7, 2011

(54) POWER OFF CONTROLLING CIRCUIT AND POWER-OFF CONTROLLING METHOD

(75) Inventor: Kimiyoshi Usami, Tokyo (JP)

(73) Assignee: Shibaura Institute of Technology, Tokyo (JP)

( * ) Notice: Subject to any disclaimer, the term of this patent is extended or adjusted under 35 U.S.C. 154(b) by 0 days.

(21) Appl. No.: 12/365,404

(22) Filed: Feb. 4, 2009

(65) Prior Publication Data
US 2010/0052770 A1 Mar. 4, 2010

(30) Foreign Application Priority Data

Aug. 27, 2008 (JP) ................................. 2008-218289

(51) Int. Cl.
*G05F 1/12* (2006.01)
(52) U.S. Cl. ........................................ 327/544; 327/143
(58) Field of Classification Search .................. 327/143, 327/544
See application file for complete search history.

(56) References Cited

U.S. PATENT DOCUMENTS

| | | | | |
|---|---|---|---|---|
| 4,733,107 | A * | 3/1988 | O'Shaughnessy et al. ... | 327/206 |
| 5,945,852 | A * | 8/1999 | Kosiec ............................ | 327/68 |
| 6,348,806 | B1 * | 2/2002 | Okandan et al. .............. | 324/763 |
| 6,483,764 | B2 * | 11/2002 | Chen Hsu et al. ............. | 365/222 |
| 6,714,473 | B1 * | 3/2004 | Fiscus ....................... | 365/189.07 |
| 7,080,270 | B2 * | 7/2006 | Yokozeki et al. .............. | 713/320 |
| 7,272,065 | B2 * | 9/2007 | Lovett ............................ | 365/222 |
| 7,279,956 | B2 * | 10/2007 | Caplan et al. ................. | 327/536 |
| 7,292,083 | B1 * | 11/2007 | Wang et al. .................... | 327/205 |
| 7,659,772 | B2 * | 2/2010 | Nomura et al. ................ | 327/544 |
| 7,719,347 | B2 * | 5/2010 | Sugimoto ...................... | 327/544 |
| 2002/0125942 | A1 * | 9/2002 | Dunnebacke et al. .......... | 330/69 |
| 2006/0170461 | A1 * | 8/2006 | Bhattacharya et al. ......... | 327/65 |
| 2006/0186946 | A1 * | 8/2006 | Hughes .......................... | 327/427 |
| 2007/0109700 | A1 * | 5/2007 | Shimogawa et al. ........... | 361/57 |

FOREIGN PATENT DOCUMENTS

| | | |
|---|---|---|
| JP | 2000-134088 | 5/2000 |
| JP | 2002-076873 | 3/2002 |
| JP | 2008-065732 | 3/2008 |
| WO | WO 2008/081916 | 7/2008 |

OTHER PUBLICATIONS

Satoshi Koyama, et al., "Design and Analysis of On-Chip Leakage Monitor Using MTCMOS Circuits," IEICE Technical Report VLD2007-144-155, The Institute of Electronics, Information and Communication Engineers (IEICE), vol. 107, No. 507, pp. 13-18, 2008.

Satoshi Koyama, et al., "Design and Analysis of On-Chip Leakage Monitor Using MTCMOS Circuit," The 23$^{rd}$ International Technical Conference on Circuits/Systems, Computers and Communications (ITC-CSCC 2008), pp. 205-208, 2008.

Office Action issued in Japanese Patent Application No. 2008-218289 mailed May 29, 2009 (*English translation provided*).

* cited by examiner

*Primary Examiner* — Thomas J Hiltunen
(74) *Attorney, Agent, or Firm* — Foley & Lardner LLP

(57) ABSTRACT

A power-off controlling circuit and a power-off controlling method that control power-off of an integrated circuit based on the size of leakage currents. The power-off controlling circuit includes a model circuit section that includes a model circuit made by modeling a basic circuit of an integrated circuit, a voltage comparing circuit section that compares an output voltage charged by a leakage current occurred at the model circuit and a preset reference voltage, a decision circuit section that measures an arrival time until the output voltage reaches the reference voltage from the compared result and decides a size of the leakage current from the measured result, and a power-off controlling circuit section that controls power-off of the integrated circuit on the basis of the decided size of the leakage current.

10 Claims, 5 Drawing Sheets

POWER OFF CONTROLLING CIRCUIT AND POWER-OFF CONTROLLING METHOD

CROSS-REFERENCE TO RELATED APPLICATIONS

The present application claims priority to Japanese Patent Application No. 2008-218289, filed Aug. 27, 2008, the entire disclosure of which is incorporated herein by reference.

BACKGROUND

The present disclosure relates to a power-off controlling circuit and a power-off controlling method.

Integrated circuits (IC) are configured to include many elements such as semiconductor devices. In recent years, thanks to advancements in fine processing technology of semiconductor devices, speeding up and high function of data processing have been realized. On the other hand, with the miniaturization of semiconductor devices, there has been a problem that leakage currents generated from semiconductor devices exponentially increase and thus power consumption of integrated circuits increase. Restraining leakage currents reduces power consumption of integrated circuits. Conventionally, generation of useless leakage currents can be restrained by turning off power in the integrated circuits when the integrated circuits are not operated.

However, the conventional method for restraining leakage currents, that is to say, a power-off method of integrated circuits is a method for turning off power regardless of the size of leakage currents occurred at the semiconductor devices when the integrated circuits are not operated. However, depending on the size of leakage currents, in this method, the power consumption of integrated circuits may increase adversely. In other words, the conventional power-off method of integrated circuits is effective when the amount of used electricity capable of being reduced by restraining leakage currents exceeds the amount of used electricity (electric power overhead) required for power-off operations and power-on operations because the leakage currents are large. On the contrary, this method has increased power consumption of integrated circuits when the amount of used electricity capable of being reduced by restraining leakage currents is smaller than the electric power overhead because the leakage currents are small.

In particular, since the size of leakage currents dynamically changes due to ambient surrounding and heat generation from integrated circuits owing to characteristics that the leak currents exponentially increase by the rise of temperature of a semiconductor device, for example, a transistor, it is desired that power-off is dynamically controlled according to the size of leakage currents. However, since the integrated circuit has a terminal for measurement and also a separate large-scale measurement circuit is required in order to directly measure leakage currents of a circuit during operations, there is a problem that the circuit is complicated and thus has an increased cost.

SUMMARY

Therefore, it is preferred to provide a new power-off controlling circuit and a new power-off controlling method that restrain an electric power overhead according to power-off operations or the like in association with the dynamic change of leakage currents and do not directly measure leakage currents occurred at a circuit during operations.

A power-off controlling apparatus according to a representative embodiment includes: a model circuit section that includes a model circuit made by modeling a basic circuit of an integrated circuit; a voltage comparing circuit section that compares an output voltage charged by a leakage current occurred at the model circuit and a preset reference voltage; a deciding circuit section that measures an arrival time until the output voltage reaches the reference voltage from the compared result and decides a size of the leakage current from the measured result; and a power-off controlling circuit section that controls power-off of the integrated circuit on the basis of the decided size of the leakage current.

Moreover, the power-off controlling apparatus of the integrated circuit according to the present invention may further include a reference voltage generating circuit section that generates the reference voltage.

Furthermore, the model circuit section may be a multi-threshold complementary metal oxide semiconductor (MTC-MOS) circuit that includes the model circuit including a first transistor with a first threshold voltage and a second transistor with a second threshold voltage higher than the first threshold voltage, and the output voltage may be a voltage of a connection interval between the model circuit and the second transistor.

Furthermore, the voltage comparing circuit section may include a current mirror type sense amplifier circuit.

Furthermore, the deciding circuit section may discharge the output voltage before deciding the size of the leakage current.

A power-off controlling method according to a representative embodiment includes: charging an output voltage by a leakage current occurred at a model circuit made by modeling a basic circuit of an integrated circuit; comparing a preset reference voltage with the charged output voltage; measuring an arrival time until the output voltage reaches the reference voltage from the compared result and deciding a size of the leakage current from the measured result; and controlling power-off of the integrated circuit on the basis of the decided size of the leakage current.

According to a power-off controlling apparatus and a power-off controlling method of the present embodiment configured as described above, since the size of leakage currents occurred at a model circuit made by modeling a basic circuit of an integrated circuit is decided, it is possible to control power-off of the integrated circuit according to the size of the leakage currents and thus reduce power consumption of the integrated circuit.

Figure 1:
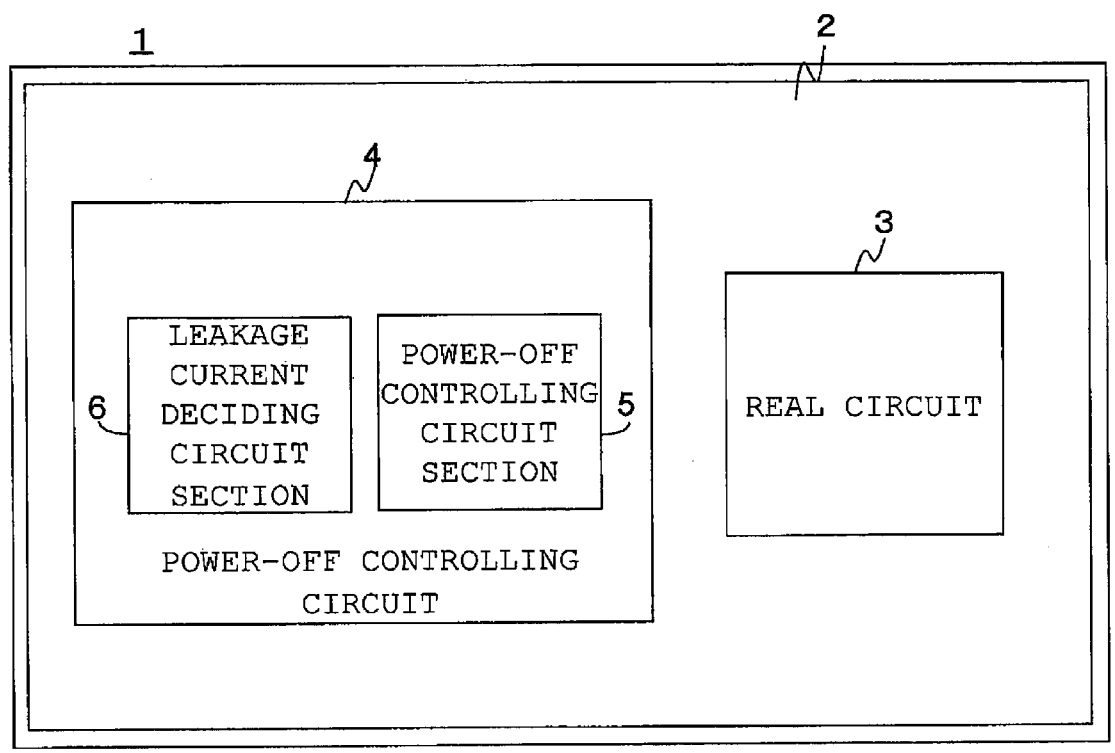
FIG. 1 is a view illustrating a schematic configuration of an integrated circuit 1 according to a representative embodiment.

Reference Numerals: 1 integrated circuit, 2 chip, 3 real circuit, 4 power-off controlling circuit, 5 power-off controlling circuit section, 6 leakage current deciding circuit section, 61 model circuit section, 62 reference voltage generating circuit section, 63 voltage comparing circuit section, 64 deciding circuit section.

DESCRIPTION OF REPRESENTATIVE EMBODIMENTS

A power-off controlling circuit and power-off controlling method are described. FIG. 1 is a view illustrating a schematic configuration of an integrated circuit 1 according to a representative embodiment. The integrated circuit 1 includes a real circuit 3 and a power-off controlling circuit 4 on a silicon substrate (referred to as "chip") 2, as illustrated in FIG. 1.

The real circuit 3 is an electronic circuit that mounts elements such as a transistor, a resistor, a capacitor, a diode, or the like on the chip 2 to have various types of functions, and is a circuit for achieving an original purpose of the integrated circuit 1 unlike with the power-off controlling circuit 4 corresponding to a special feature of the present embodiment. In addition, since the real circuit 3 can have various kinds of circuit configurations and functions in accordance with purposes using well-known arts, the detailed descriptions are omitted.

The power-off controlling circuit 4 is a control circuit that turns off the power of the real circuit 3, and for example, controls on/off of a switch located on a path for supplying power arranged in the real circuit 3 in order to control power-off by which electric power is supplied to each element. The power-off controlling circuit 4 includes a power-off controlling circuit section 5 that sends a command signal turning off power to the real circuit 3 and a leakage current deciding circuit section 6 that decides whether the command signal is sent or not on the basis of the size of leakage currents. In addition, the power-off controlling circuit 4 of the present embodiment is particularly different from a conventional power-off controlling circuit in that the power-off controlling circuit 4 includes the leakage current deciding circuit section 6.

The power-off controlling circuit section 5 regularly sends a signal requesting a decision result to the leakage current deciding circuit section 6 to cause the leakage current deciding circuit section 6 to decide the size of leakage currents that is described below and acquires the decision result from the leakage current deciding circuit section 6. Then, the power-off controlling circuit section 5 sends a command signal turning off power to the real circuit 3 at a desired timing on the basis of the acquired decision result when the size of the leakage currents are larger than a reference value. Here, a reference value is a leakage current value when an amount of used electricity capable of being reduced by restraining leakage currents exceeds an amount of used electricity required for power-off and power-on operations. Moreover, a desired timing is a periodical timing, for example, when the real circuit 3 is in a standby state.

The leakage current deciding circuit section 6 receives the signal requesting the decision result from the power-off controlling circuit section 5 and decides the size of leakage currents. The leakage current deciding circuit section 6 includes a model circuit section 61, a reference voltage generating circuit section 62, a voltage comparing circuit section 63, and a deciding circuit section 64 as illustrated in FIG. 2.

The model circuit section 61 includes a model circuit made by modeling a basic circuit of the real circuit 3, and the model circuit is a dedicated circuit for generating leakage currents unlike with the real circuit 3 arranged in the chip 2. As described above, leakage currents have a characteristic that it is dependent on temperature. Therefore, in the present embodiment, since the real circuit 3 and the model circuit made by modeling a basic circuit of the real circuit 3 are provided on the same chip 2, temperature environments of both circuits approximate to each other and thus characteristics of leakage currents occurred at the real circuit 3 and leakage currents occurred at the model circuit approximate to each other. The real circuit 3 and the model circuit can be thermally coupled. Therefore, since the size of leakage currents occurred at the model circuit is regularly decided, the leakage currents from the real circuit 3 can be estimated and the power-off of the real circuit 3 can be dynamically controlled without directly measuring leakage currents in the real circuit 3.

Additionally, multiple model circuit sections can model the leakage current in different parts of the real circuit. The individual model circuit sections can be thermally coupled to the various parts of the real circuit. Hence, the power in each part of the real circuit can be individually controlled. Each of the multiple model circuit sections can be a different model specifically related to each part of the real circuit.

Figure 2:
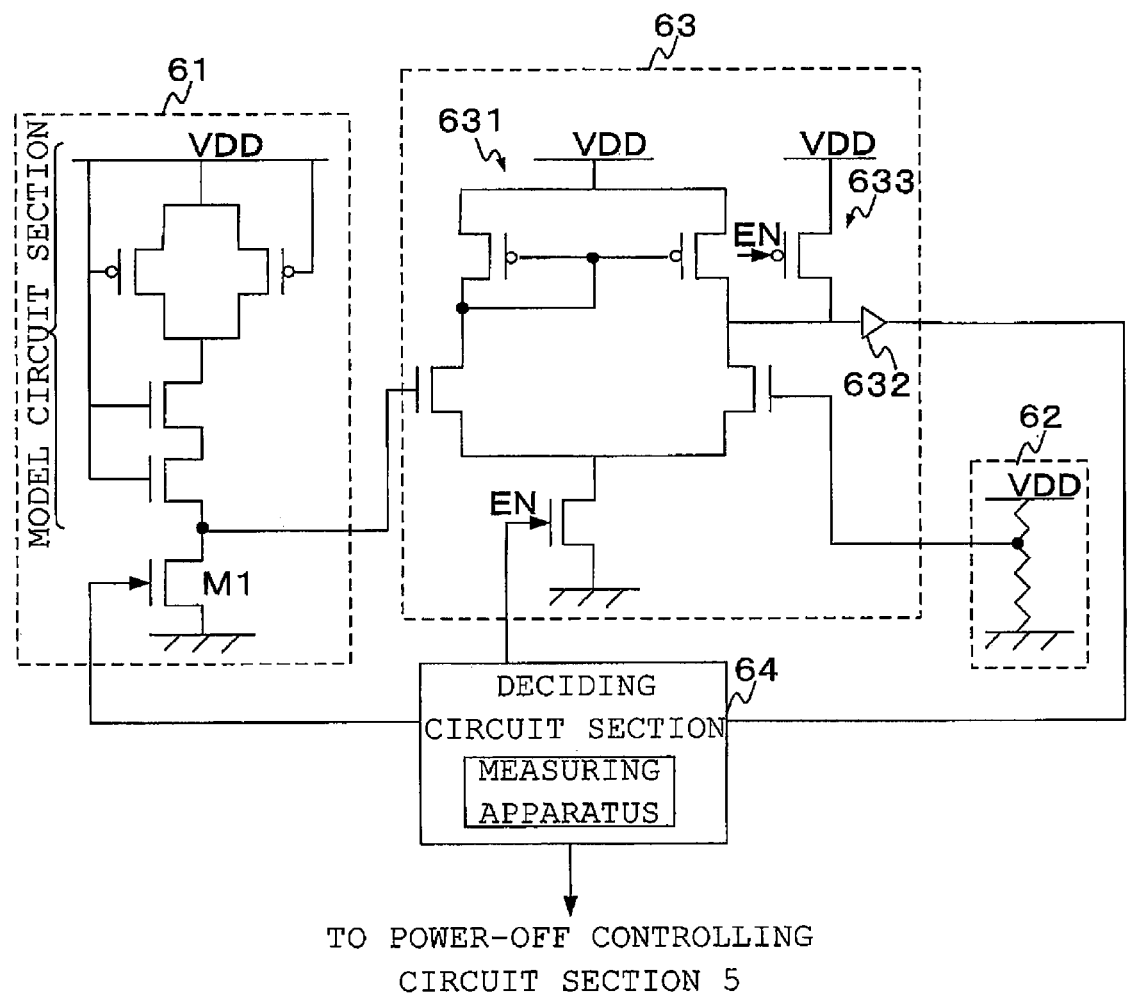
FIG. 2 is a view illustrating a configuration of a power-off controlling circuit 4 of the integrated circuit 1 according to a representative embodiment.

Moreover, as illustrated in FIG. 2, the model circuit section 61 includes a MTCMOS circuit having transistors of which threshold voltages are different from each other. The MTCMOS circuit includes a model circuit having a transistor with a first threshold voltage and a transistor M1 with a second threshold voltage higher than the first threshold voltage, in which the transistor M1 is inserted between the model circuit and a ground line. Here, the model circuit is a basic logic circuit, for example, a NAND circuit that constitutes the real circuit 3.

In the model circuit section 61 configured as described above, electric charges are accumulated between the model circuit and the ground line by leakage currents occurred at the model circuit and thus an output voltage $V_{OUT}$ is charged when the transistor M1 is turned off. Then, the model circuit section 61 supplies the charged output voltage $V_{OUT}$ to the voltage comparing circuit section 63. Moreover, the model circuit section 61 receives a turn-on signal for turning on the transistor M1 from the deciding circuit section 64 to initialize itself through the discharge of electric charges by which the output voltage $V_{OUT}$ becomes 0V.

The reference voltage generating circuit section 62 is a circuit that generates a preset reference voltage $V_{ref}$ and supplies the generated reference voltage $V_{ref}$ to the voltage comparing circuit section 63. In addition, the reference voltage generating circuit section 62 may arrange a variable resistance between a power supply and a ground line to generate a desired reference voltage by means of the variable resistance.

The voltage comparing circuit section 63 includes a voltage comparing circuit 631 that compares the output voltage $V_{OUT}$ charged by leakage currents occurred at the model circuit and the preset reference voltage $V_{ref}$. The voltage comparing circuit 631 is a current mirror type sense amplifier circuit that can compare both voltages and output the compared result. Since the current mirror type sense amplifier is a static circuit for performing non-destructive reading, the current mirror type sense amplifier is suitable to continuously compare voltages. In addition, since configurations and operations of the current mirror type sense amplifier circuit are similar to those of a conventional circuit, the detailed descriptions are omitted.

Moreover, since a rising edge of an output signal from the current mirror type sense amplifier circuit becomes gentle when the output from the current mirror type sense amplifier circuit rises up to $V_{DD}$ at a maximum and the climbing speed of the supplied output voltage $V_{OUT}$ is slow, the voltage comparing circuit section 63 can provide therein a buffer circuit 632 such that the output signal is easily used in the deciding circuit section 64. Since the buffer circuit 632 is provided, the deciding circuit section 64 that receives an output signal can accurately detect the output signal. Furthermore, when the voltage comparing circuit section 63 does not compare the output voltage $V_{OUT}$ and the reference voltage $V_{ref}$, the voltage comparing circuit section 63 may provide a holder circuit 633 that fixes the output signal from the current mirror type sense amplifier circuit to $V_{DD}$ between the current mirror type sense amplifier circuit 631 and the buffer circuit 632. Since the holder circuit 633 is provided, effects on a subsequent-stage circuit, which are caused by penetrating currents can be restrained. The penetrating currents are generated when NMOS of the current mirror type sense amplifier circuit 631 is turned off. In addition, the buffer circuit 632 or the holder circuit 633 may not be appropriately provided.

The voltage comparing circuit section 63 configured as described above receives an enable (EN) signal (0→1) from the deciding circuit section 64 to start comparison between the output voltage $V_{OUT}$ and the reference voltage $V_{ref}$, and sends the compared result to the deciding circuit section 64 as an output signal. Moreover, the voltage comparing circuit section 63 receives an enable (EN) signal (1→0) from the deciding circuit section 64 to terminate comparison between both voltages and send the output signal $V_{DD}$ to the deciding circuit section 64 through the holder circuit 633. Here, at the thought of the output signal from the voltage comparing circuit section 63, the output signal is changed as described below, for example. The output signal is $V_{DD}$ by the holder circuit 633 before receiving the EN signal (0→1). After receiving the EN signal (0→1), the output signal is 0V when the reference voltage $V_{ref}$ is higher than the output voltage $V_{OUT}$ and becomes $V_{DD}$ when the output voltage $V_{OUT}$ reaches the reference voltage $V_{ref}$.

The deciding circuit section 64 receives the output signal from the voltage comparing circuit section 63, measures an arrival time until the output voltage $V_{OUT}$ reaches the reference voltage $V_{ref}$ from the output signal, and decides the size of leakage currents from the measured result. The deciding circuit section 64 includes a measuring apparatus that measures an arrival time until the output voltage $V_{OUT}$ reaches the reference voltage $V_{ref}$. Moreover, the deciding circuit section 64 receives a signal requesting a decision result from the power-off controlling circuit section 5, and outputs a turn-on signal to initialize the model circuit section 61 and sends each signal for starting voltage comparison in the voltage comparing circuit section 63 as described above. For example, the measuring apparatus is a clock counter. The deciding circuit section 64 can measure an arrival time with the number of clocks until the size of the output signal received from the voltage comparing circuit section 63 is changed (0V→$V_{DD}$) by means of the clock counter.

Figure 3:
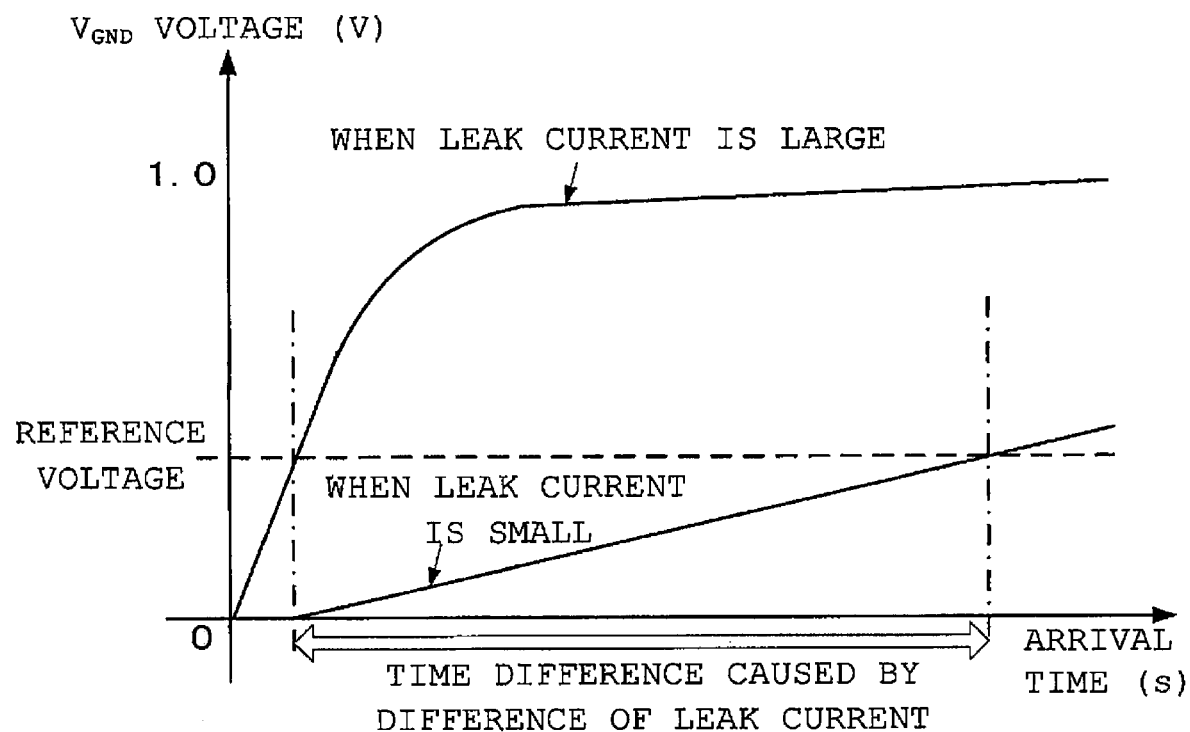
FIG. 3 is a view illustrating a climbing speed of an output voltage according to the size of leakage currents of the integrated circuit 1 according to a representative embodiment.
Figure 4:
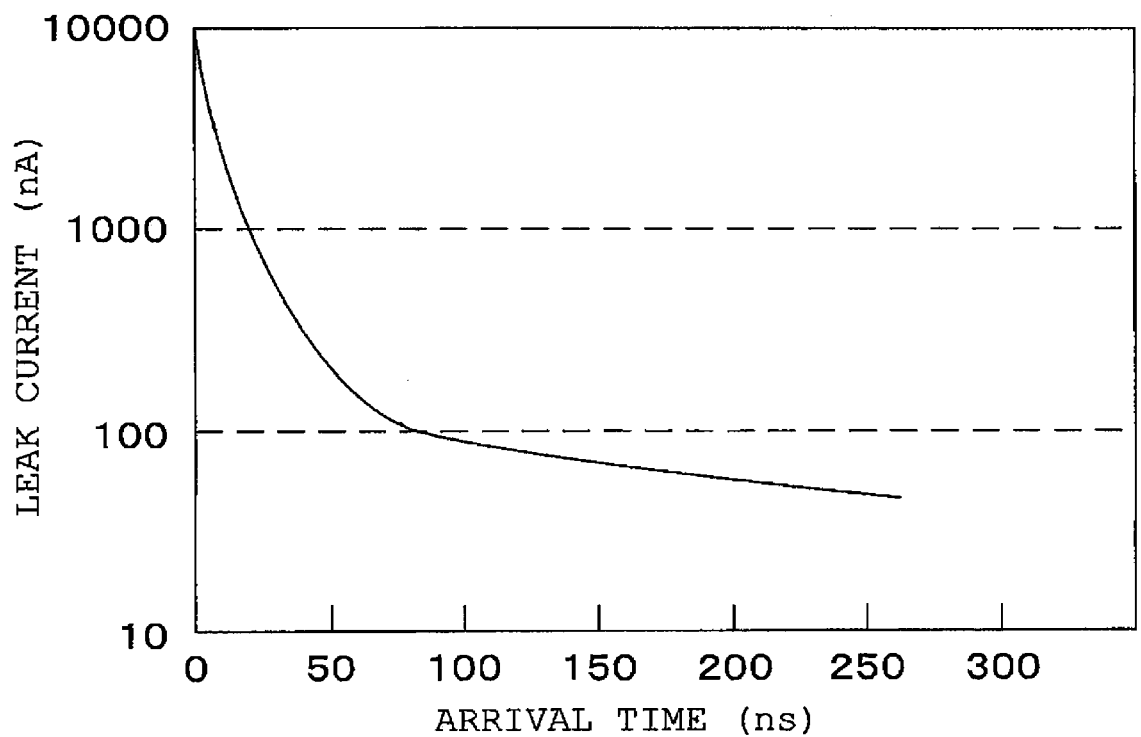
FIG. 4 is a view exemplary showing relation between leakage currents and arrival time when simulating operations of a leakage current deciding circuit section 6 of the integrated circuit 1 according to a representative embodiment.

Here, when it is described about an arrival time until the output voltage $V_{OUT}$ reaches the reference voltage $V_{ref}$ from the output signal, the arrival time largely varies depending on the size of leakage currents. In other words, since the output voltage $V_{OUT}$ rises by having electric charges being accumulated by the leakage currents occurred from the model circuit, the arrival time when the leakage currents are large is shortened in comparison with the case when the leakage currents are small, as illustrated in FIG. 3. In addition, FIG. 4 illustrates an example of relation between the leakage currents and the arrival time when operations of the leakage current deciding circuit 6 in the integrated circuit 1 according to the present embodiment are simulated (when the reference voltage $V_{ref}$ is 0.35V). As illustrated in FIG. 4, since there is correlation between the size of leakage currents and the arrival times, the deciding circuit section 64 can measure the arrival time to decide the size of leakage currents. In addition, the deciding circuit section 64 may previously store the relation between the size of leakage currents and the arrival time as a lookup table and decide the size of leakage currents from the arrival time on the basis of the stored lookup table.

Figure 5:
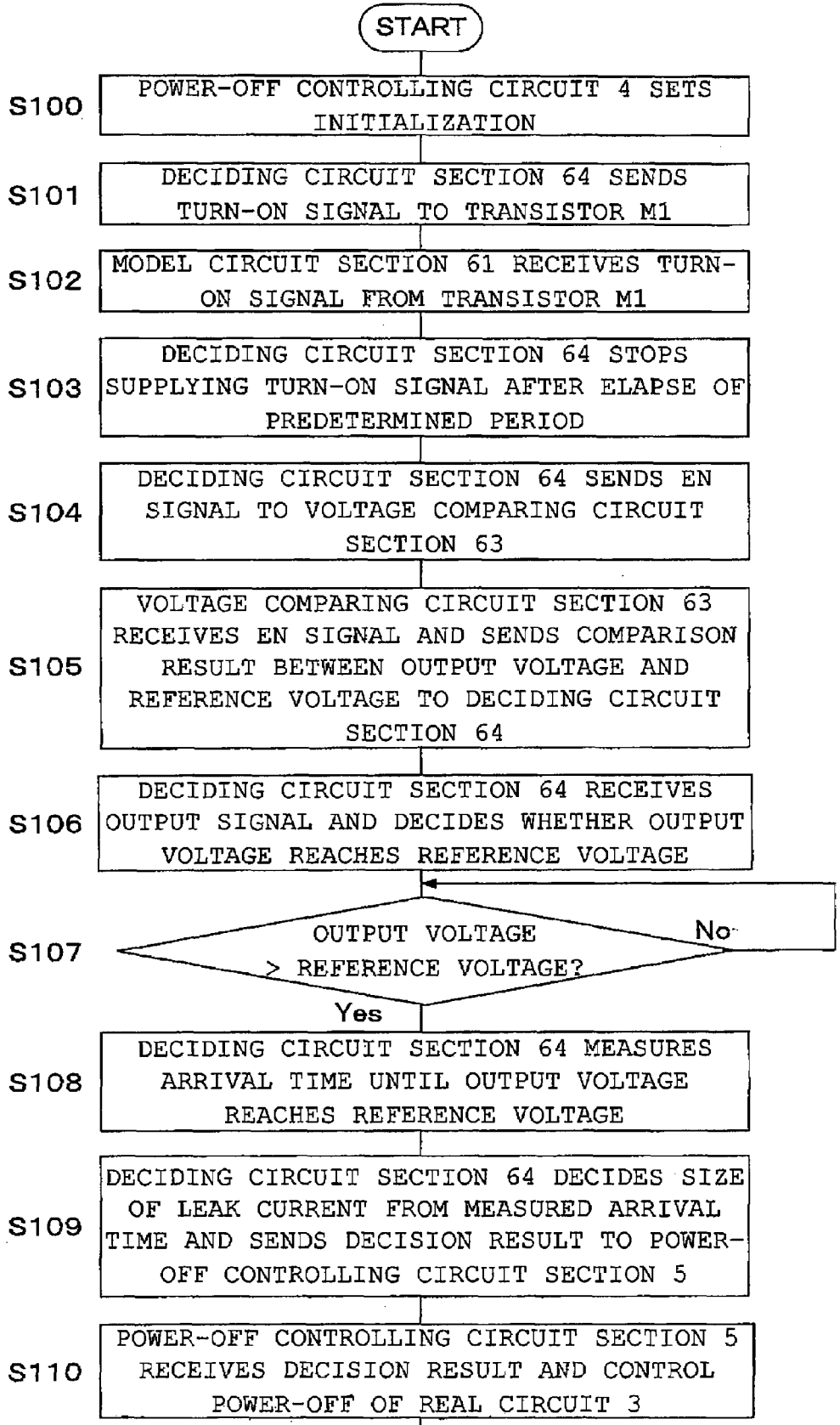
FIG. 5 is a flowchart illustrating a processing matter of the power-off controlling circuit 4 according to a representative embodiment.

Hereinafter, a power-off controlling method in the power-off controlling circuit 4 will be described with reference to a flowchart illustrated in FIG. 5.

First, the power-off controlling circuit 4 performs initialization setting of the model circuit 61 before deciding the size of leakage currents (step S100). The initialization setting is performed by the procedure that the power-off controlling circuit section 5 regularly sends a signal requesting a decision result to the deciding circuit section 64 so as to cause the deciding circuit section 64 to decide the size of leakage currents.

Subsequently, the deciding circuit section 64 sends a turn-on signal for turning on the transistor M1 in the model circuit section-61 (step S101). Moreover, the deciding circuit section 64 sends the turn-on signal and also resets a clock counter included in the deciding circuit section 64.

In the model circuit section 61, the transistor M1 receives the turn-on signal from the deciding circuit section 64 (step S102). The model circuit section 61 discharges electric charges accumulated by the leakage currents occurred at the model circuit by turning on the transistor M1, and thus the output voltage $V_{OUT}$ output to the voltage comparing circuit section 63 is initialized to 0V. Since the model circuit section 61 once discharges the output voltage before deciding the size of leakage currents, the arrival time until the output voltage $V_{OUT}$ reaches the reference voltage $V_{ref}$ can be accurately measured.

Subsequently, the deciding circuit section 64 stops supplying the turn-on signal to the transistor M1 after the elapse of a predetermined period (S103). The model circuit section 61 starts accumulating electric charges between the model circuit and the transistor with the leakage currents occurred at the model circuit by turning off the transistor M1, and thus the output voltage $V_{OUT}$ is charged. Here, the predetermined period may mean a time interval for which the accumulated electric charges are sufficiently discharged.

Next, the deciding circuit section 64 sends an enable (EN) signal to the voltage comparing circuit section 63 (step S104) Moreover, the deciding circuit section 64 sends the EN signal and also starts the clock counter included in the deciding circuit section 64.

The voltage comparing circuit section 63 starts comparing the output voltage $V_{OUT}$ from the model circuit section 61 and the reference voltage $V_{ref}$ from the reference voltage generating circuit section 62 and sends an output signal corresponding to a compared result to the deciding circuit section 64, in response to the fact that the voltage comparing circuit 631 and the holder circuit 633 in the voltage comparing circuit section 63 receive the EN signal (step S105).

Subsequently, the deciding circuit section 64 receives the output signal as the compared result from the voltage comparing circuit section 63 and judges whether the output voltage $V_{OUT}$ reaches the reference voltage $V_{ref}$ on the basis of the output signal (step S106).

The deciding circuit section 64 holds this state until the output voltage $V_{OUT}$ reaches the reference voltage $V_{ref}$ (step S107: No). When the output voltage $V_{OUT}$ reaches the reference voltage $V_{ref}$ (step S107: Yes), the deciding circuit section 64 measures an arrival time until the output voltage $V_{OUT}$ reaches the reference voltage $V_{ref}$ using the clock counter (step S108).

The deciding circuit section 64 decides the size of leakage currents from the measured arrival time and sends the decision result to the power-off controlling circuit section 5 (step S109). As described above, a characteristic of leakage currents occurred at each of the model circuit and the real circuit 3 approximates to each other. Therefore, the decision result of the size of leakage currents by the deciding circuit section 64 becomes an estimated result of the size of leakage currents occurred at the real circuit 3.

The power-off controlling circuit section 5 controls power-off of the real circuit 3 on the basis of the acquired decision result (step S110). In other words, the power-off controlling circuit section 5 performs power-off of the real circuit 3 when acquiring a decision result that the leakage currents are large and does not perform power-off of the real circuit 3 when acquiring a decision result that the leakage currents are small.

As described above, according to the power-off controlling method of the present embodiment, since the size of leakage currents in the real circuit 3 is estimated by deciding the size of leakage currents occurred at a model circuit made by modeling a basic circuit of an integrated circuit and the power-off of the integrated circuit is controlled on the basis of the estimated size of leakage currents, it is possible to restrain an electric power overhead and thus reduce power consumption of the integrated circuit.

Moreover, it is possible to prevent attenuation by an external factor such as wires by providing a reference voltage generating circuit section for generating a reference voltage in the same chip.

Furthermore, it is possible to decide the size of leakage currents on the basis of a voltage between the model circuit and the transistor M1 charged by leakage currents from the model circuit because a MTCMOS circuit is adopted as the model circuit section 61.

Although the representative embodiments have been described by way of examples, it should be understood that those skilled in the art might make many changes and substitutions without departing from the spirit and the scope of the present invention.

For example, although a NAND circuit has been used as the model circuit in the present embodiment, it is not limited to this case. The model circuit may be a circuit that can measure leakage currents occurred at the model circuit, or may be, for example, an inverter circuit, a NOR circuit, or a circuit made by combining a plurality of logic circuits.

Moreover, although the reference voltage generating circuit section 62 has been provided in the leakage current deciding circuit 6 in the present embodiment, it is not limited to this case. For example, the reference voltage $V_{ref}$ may be supplied from the outside of the leakage current deciding circuit 6 to the voltage comparing circuit section 63.

Furthermore, although the model circuit section has used a MTCMOS circuit including transistors with different threshold voltages in the present embodiment, it is not limited to this case. For example, the model circuit section may include only a logic circuit made by modeling a basic circuit of an integrated circuit that can output a result obtained by comparing two voltages.

In addition, although the voltage comparing circuit section has used a current mirror type sense amplifier circuit in the present embodiment, it is not limited to this case. The voltage comparing circuit section may use a circuit that can output a result obtained by comparing two voltages.

What is claimed is:

1. A power-off controlling circuit comprising:
    a model circuit section that comprises a model circuit made by modeling a basic circuit of an integrated circuit to be controlled, wherein the model circuit includes a first transistor comprising a first threshold voltage and the model circuit is configured to be charged by turning off a second transistor comprising a second threshold voltage higher than the first threshold voltage;
    a voltage comparing circuit section that compares an output voltage charges by a leakage current occurred at the model circuit and a preset reference voltage;
    a deciding circuit section that measures an arrival time until the output voltage reaches the reference voltage from the compared result and decides a size of the leakage current from the measured result; and
    a power-off controlling circuit section configured to power-off the integrated circuit on the basis of the decided size of the leakage current.

2. The power-off controlling circuit according to claim 1, further comprising a reference voltage generating circuit section that generates the reference voltage.

3. The power-off controlling circuit according to claim 1, wherein
    the model circuit section is a MTCMOS circuit
    the output voltage is a voltage of a connection interval between first transistor and the second transistor.

4. The power-off controlling circuit according to claim 1, wherein the voltage comparing circuit section comprises a current mirror type sense amplifier circuit.

5. The power-off controlling circuit according to claim 1, wherein the deciding circuit section discharges the output voltage before deciding the size of the leakage current.

6. The power-off controlling circuit according to claim 1, wherein the power-off controlling circuit section is configured to turn off the integrated circuit.

7. The power-off controlling circuit according to claim 1, wherein at least one of a source or a drain of the second transistor is electrically connected to ground.

8. A power-off controlling method comprising:
    charging an output voltage by a leakage current occurred at a model circuit made by modeling a basic circuit of an integrated circuit, wherein the model circuit includes a first transistor comprising a first threshold voltage and the model circuit is configured to be charged by turning off a second transistor comprising a second threshold voltage higher than the first threshold voltage;
    comparing a preset reference voltage with the charged output voltage;
    measuring an arrival time until the output voltage reaches the reference voltage from the compared result and deciding a size of the leakage current from the measured result; and
    power-off the integrated circuit on the basis of the decided size of the leakage current.

9. The power-off controlling method according to claim 8, wherein powering-off of the integrated circuit comprises turning off the integrated circuit.

10. The power-off controlling method according to claim 8, wherein at least one of a source or a drain of the second transistor is electrically connected to ground.

* * * * *

UNITED STATES PATENT AND TRADEMARK OFFICE
CERTIFICATE OF CORRECTION

PATENT NO. : 7,956,678 B2  Page 1 of 1
APPLICATION NO. : 12/365404
DATED : June 7, 2011
INVENTOR(S) : Usami It is certified that error appears in the above-identified patent and that said Letters Patent is hereby corrected as shown below:

On the Face Page, in Field (54), in Title, in Column 1, Line 1, delete "POWER OFF" and insert -- POWER-OFF --, therefor.

In Fig. 2, Sheet 2 of 5, delete "VDD" and insert -- $V_{DD}$ --, therefor at each occurrence throughout the Figure 2.

In Fig. 3, Sheet 3 of 5, delete "  " and insert --            --, therefor.

In Column 1, Line 1, delete "POWER OFF" and insert -- POWER-OFF --, therefor.

In Column 3, Line 8, delete "DESCRIPTION" and insert -- DETAILED DESCRIPTION --, therefor.

In Column 8, Line 27, in Claim 3, delete "circuit" and insert -- circuit, and --, therefor.

Signed and Sealed this
Tenth Day of April, 2012

David J. Kappos
*Director of the United States Patent and Trademark Office*